United States Patent
Nagase et al.

(10) Patent No.: US 8,396,702 B2
(45) Date of Patent: Mar. 12, 2013

(54) ANALYZING APPARATUS AND DATA STORAGE METHOD

(75) Inventors: Kenji Nagase, Kawasaki (JP); Eiji Ohta, Kawasaki (JP); Yuji Suwa, Kawasaki (JP); Toshiro Sato, Kawasaki (JP); Atsushi Takeuchi, Kawasaki (JP); Kumiko Teramae, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 749 days.

(21) Appl. No.: 12/569,142

(22) Filed: Sep. 29, 2009

(65) Prior Publication Data

US 2010/0088566 A1    Apr. 8, 2010

(30) Foreign Application Priority Data

Oct. 6, 2008    (JP) .................................. 2008-260175

(51) Int. Cl.
*G06F 17/50* (2006.01)
*G06G 7/62* (2006.01)
(52) U.S. Cl. ......................................................... 703/13
(58) Field of Classification Search ...................... 703/13
See application file for complete search history.

(56) References Cited

U.S. PATENT DOCUMENTS

| | | | | |
|---|---|---|---|---|
| 5,122,876 A | * | 6/1992 | Aoki | 375/240.14 |
| 7,527,209 B2 | * | 5/2009 | Silverbrook | 235/494 |
| 7,570,291 B2 | * | 8/2009 | Tsuruoka | 348/277 |
| 2003/0185464 A1 | * | 10/2003 | Maenaka et al. | 382/300 |

FOREIGN PATENT DOCUMENTS

| | | |
|---|---|---|
| EP | 1617309 A1 | 1/2006 |
| JP | 5-073649 A | 3/1993 |
| JP | 5-282407 A | 10/1993 |

OTHER PUBLICATIONS

Donderici et al, "Improved FDTD Subgridding Algorithms Via Digital Filtering and Domain Overriding", IEEE Transactions on Antennas and Propagation, vol. 53, No. 9, Sep. 2005.*
German Office Action dated Jun. 24, 2011, issued in corresponding German Patent Application No. 102009039335.8-53.

* cited by examiner

*Primary Examiner* — Mary C Jacob
(74) *Attorney, Agent, or Firm* — Westerman, Hattori, Daniels & Adrian, LLP

(57) ABSTRACT

An analyzing apparatus includes a result-data storing unit that determines whether result data that is calculated as a result of analysis is restorable by linear interpolation. If the result data is determined to be unrestorable by the linear interpolation, the result-data storing unit stores the result data in a predetermined storage unit. Moreover, the analyzing apparatus includes a data restoring unit that reads the result data from the storage unit. The data restoring unit performs the linear interpolation using the result data acquired, thereby restoring the result data.

6 Claims, 17 Drawing Sheets

| x-AXIS MINIMUM NUMBER | y-AXIS MINIMUM NUMBER | z-AXIS MINIMUM NUMBER | x-AXIS MAXIMUM NUMBER | y-AXIS MAXIMUM NUMBER | z-AXIS MAXIMUM NUMBER |
|---|---|---|---|---|---|

FIG.3

| NUMBER OF MATERIALS |
|---|

| MATERIAL NUMBER 1 |
|---|
| MATERIAL NAME |
| PROPERTY VALUE (PERMITTIVITY, CONDUCTIVITY, PERMEABILITY, etc.) |

⎫ CONTENTS OF MATERIAL NUMBER 1

| MATERIAL NUMBER 2 |
|---|
| MATERIAL NAME |
| PROPERTY VALUE (PERMITTIVITY, CONDUCTIVITY, PERMEABILITY, etc.) |

⎫ CONTENTS OF MATERIAL NUMBER 2

...

| VALUE OF m | VALUE OF n | VALUE OF o |
|---|---|---|

| MATERIAL NUMBER CORRESPONDING TO $i=1, j=1, k=1$ |
|---|
| MATERIAL NUMBER CORRESPONDING TO $i=2, j=1, k=1$ |
| ... |
| MATERIAL NUMBER CORRESPONDING TO $i=1, j=2, k=1$ |
| MATERIAL NUMBER CORRESPONDING TO $i=2, j=2, k=1$ |
| ... |

FIG.4

| NUMBER OF CIRCUIT ELEMENTS |
|---|
| CIRCUIT ELEMENT NUMBER 1 |
| CIRCUIT ELEMENT NAME |
| CIRCUIT ELEMENT TYPE (RESISTANCE, CAPACITOR, COIL, etc.) |
| VALUE |
| DIRECTION AND POSITION OF CIRCUIT ELEMENT (x, y, z) (i, j, k) |
| CIRCUIT ELEMENT NUMBER 2 |
| CIRCUIT ELEMENT NAME |
| CIRCUIT ELEMENT TYPE (RESISTANCE, CAPACITOR, COIL, etc.) |
| VALUE |
| DIRECTION AND POSITION OF CIRCUIT ELEMENT (x, y, z) (i, j, k) |
| ... |

Rows 2–6: CONTENTS OF CIRCUIT ELEMENT NUMBER 1

Rows 7–11: CONTENTS OF CIRCUIT ELEMENT NUMBER 2

FIG.11

STORE ONLY X-AXIS DATA BECAUSE DATA IS NEAR MEDIA BORDER
STORE DATA BECAUSE DATA IS ON ANALYSIS BORDER

| Ex(1, 2, 1) | Ey(1, 2, 1) | Ez(1, 2, 1) |
|---|---|---|
| Hx(1, 2, 1) | Hy(1, 2, 1) | Hz(1, 2, 1) |
| Ex(2, 2, 1) | Ey(2, 2, 1) | Ez(2, 2, 1) |
| Hx(2, 2, 1) | Hy(2, 2, 1) | Hz(2, 2, 1) |
| Ex(3, 2, 1) | Ey(3, 2, 1) | Ez(3, 2, 1) |
| Hx(3, 2, 1) | Hy(3, 2, 1) | Hz(3, 2, 1) |
| Ex(4, 2, 1) | Ey(4, 2, 1) | Ez(4, 2, 1) |
| Hx(4, 2, 1) | Hy(4, 2, 1) | Hz(4, 2, 1) |
| Ex(5, 2, 1) | Ey(5, 2, 1) | Ez(5, 2, 1) |
| Hx(5, 2, 1) | Hy(5, 2, 1) | Hz(5, 2, 1) |
| Ex(6, 2, 1) | Ey(6, 2, 1) | Ez(6, 2, 1) |
| Hx(6, 2, 1) | Hy(6, 2, 1) | Hz(6, 2, 1) |
| Ex(7, 2, 1) | Ey(7, 2, 1) | Ez(7, 2, 1) |
| Hx(7, 2, 1) | Hy(7, 2, 1) | Hz(7, 2, 1) |
| Ex(8, 2, 1) | Ey(8, 2, 1) | Ez(8, 2, 1) |
| Hx(8, 2, 1) | Hy(8, 2, 1) | Hz(8, 2, 1) |
| Ex(9, 2, 1) | Ey(9, 2, 1) | Ez(9, 2, 1) |
| Hx(9, 2, 1) | Hy(9, 2, 1) | Hz(9, 2, 1) |
| Ex(10, 2, 1) | Ey(10, 2, 1) | Ez(10, 2, 1) |
| Hx(10, 2, 1) | Hy(10, 2, 1) | Hz(10, 2, 1) |
| Ex(11, 2, 1) | Ey(11, 2, 1) | Ez(11, 2, 1) |
| Hx(11, 2, 1) | Hy(11, 2, 1) | Hz(11, 2, 1) |
| Ex(12, 2, 1) | Ey(12, 2, 1) | Ez(12, 2, 1) |
| Hx(12, 2, 1) | Hy(12, 2, 1) | Hz(12, 2, 1) |
| Ex(13, 2, 1) | Ey(13, 2, 1) | Ez(13, 2, 1) |
| Hx(13, 2, 1) | Hy(13, 2, 1) | Hz(13, 2, 1) |
| Ex(14, 2, 1) | Ey(14, 2, 1) | Ez(14, 2, 1) |
| Hx(14, 2, 1) | Hy(14, 2, 1) | Hz(14, 2, 1) |
| Ex(15, 2, 1) | Ey(15, 2, 1) | Ez(15, 2, 1) |
| Hx(15, 2, 1) | Hy(15, 2, 1) | Hz(15, 2, 1) |
| Ex(16, 2, 1) | Ey(16, 2, 1) | Ez(16, 2, 1) |
| Hx(16, 2, 1) | Hy(16, 2, 1) | Hz(16, 2, 1) |
| Ex(16, 2, 1) | Ey(16, 2, 1) | Ez(16, 2, 1) |
| Hx(16, 2, 1) | Hy(16, 2, 1) | Hz(16, 2, 1) |
| Ex(17, 2, 1) | Ey(17, 2, 1) | Ez(17, 2, 1) |
| Hx(17, 2, 1) | Hy(17, 2, 1) | Hz(17, 2, 1) |
| Ex(18, 2, 1) | Ey(18, 2, 1) | Ez(18, 2, 1) |
| Hx(18, 2, 1) | Hy(18, 2, 1) | Hz(18, 2, 1) |
| Ex(19, 2, 1) | Ey(19, 2, 1) | Ez(19, 2, 1) |
| Hx(19, 2, 1) | Hy(19, 2, 1) | Hz(19, 2, 1) |
| Ex(20, 2, 1) | Ey(20, 2, 1) | Ez(20, 2, 1) |
| Hx(20, 2, 1) | Hy(20, 2, 1) | Hz(20, 2, 1) |

DATA COMPRESSION →

| Ex(1, 2, 1) | Ey(1, 2, 1) | Ez(1, 2, 1) |
|---|---|---|
| Hx(1, 2, 1) | Hy(1, 2, 1) | Hz(1, 2, 1) |
| Ex(4, 2, 1) | | |
| Hx(4, 2, 1) | | |
| Ex(7, 2, 1) | | |
| Hx(7, 2, 1) | | |
| Ex(13, 2, 1) | | |
| Hx(13, 2, 1) | | |
| Ex(16, 2, 1) | Ey(16, 2, 1) | Ez(16, 2, 1) |
| Hx(16, 2, 1) | Hy(16, 2, 1) | Hz(16, 2, 1) |

STORE DATA BECAUSE DATA IS ON ANALYSIS BORDER

FIG.12

STORE ONLY Y-AXIS DATA BECAUSE DATA IS ON MEDIA BORDER
STORE ONLY Y-AXIS DATA BECAUSE DATA IS ON MEDIA BORDER
STORE DATA BECAUSE DATA IS ON MEDIA BORDER
STORE DATA BECAUSE DATA IS ON ANALYSIS BORDER

| | | |
|---|---|---|
| Ex(1, 3, 1) | Ey(1, 3, 1) | Ez(1, 3, 1) |
| Hx(1, 3, 1) | Hy(1, 3, 1) | Hz(1, 3, 1) |
| Ex(2, 3, 1) | Ey(2, 3, 1) | Ez(2, 3, 1) |
| Hx(2, 3, 1) | Hy(2, 3, 1) | Hz(2, 3, 1) |
| Ex(3, 3, 1) | Ey(3, 3, 1) | Ez(3, 3, 1) |
| Hx(3, 3, 1) | Hy(3, 3, 1) | Hz(3, 3, 1) |
| Ex(4, 3, 1) | Ey(4, 3, 1) | Ez(4, 3, 1) |
| Hx(4, 3, 1) | Hy(4, 3, 1) | Hz(4, 3, 1) |
| Ex(5, 3, 1) | Ey(5, 3, 1) | Ez(5, 3, 1) |
| Hx(5, 3, 1) | Hy(5, 3, 1) | Hz(5, 3, 1) |
| Ex(6, 3, 1) | Ey(6, 3, 1) | Ez(6, 3, 1) |
| Hx(6, 3, 1) | Hy(6, 3, 1) | Hz(6, 3, 1) |
| Ex(7, 3, 1) | Ey(7, 3, 1) | Ez(7, 3, 1) |
| Hx(7, 3, 1) | Hy(7, 3, 1) | Hz(7, 3, 1) |
| Ex(8, 3, 1) | Ey(8, 3, 1) | Ez(8, 3, 1) |
| Hx(8, 3, 1) | Hy(8, 3, 1) | Hz(8, 3, 1) |
| Ex(9, 3, 1) | Ey(9, 3, 1) | Ez(9, 3, 1) |
| Hx(9, 3, 1) | Hy(9, 3, 1) | Hz(9, 3, 1) |
| Ex(10, 3, 1) | Ey(10, 3, 1) | Ez(10, 3, 1) |
| Hx(10, 3, 1) | Hy(10, 3, 1) | Hz(10, 3, 1) |
| Ex(11, 3, 1) | Ey(11, 3, 1) | Ez(11, 3, 1) |
| Hx(11, 3, 1) | Hy(11, 3, 1) | Hz(11, 3, 1) |
| Ex(12, 3, 1) | Ey(12, 3, 1) | Ez(12, 3, 1) |
| Hx(12, 3, 1) | Hy(12, 3, 1) | Hz(12, 3, 1) |
| Ex(13, 3, 1) | Ey(13, 3, 1) | Ez(13, 3, 1) |
| Hx(13, 3, 1) | Hy(13, 3, 1) | Hz(13, 3, 1) |
| Ex(14, 3, 1) | Ey(14, 3, 1) | Ez(14, 3, 1) |
| Hx(14, 3, 1) | Hy(14, 3, 1) | Hz(14, 3, 1) |
| Ex(15, 3, 1) | Ey(15, 3, 1) | Ez(15, 3, 1) |
| Hx(15, 3, 1) | Hy(15, 3, 1) | Hz(15, 3, 1) |
| Ex(16, 3, 1) | Ey(16, 3, 1) | Ez(16, 3, 1) |
| Hx(16, 3, 1) | Hy(16, 3, 1) | Hz(16, 3, 1) |
| Ex(16, 3, 1) | Ey(16, 3, 1) | Ez(16, 3, 1) |
| Hx(16, 3, 1) | Hy(16, 3, 1) | Hz(16, 3, 1) |
| Ex(17, 3, 1) | Ey(17, 3, 1) | Ez(17, 3, 1) |
| Hx(17, 3, 1) | Hy(17, 3, 1) | Hz(17, 3, 1) |
| Ex(18, 3, 1) | Ey(18, 3, 1) | Ez(18, 3, 1) |
| Hx(18, 3, 1) | Hy(18, 3, 1) | Hz(18, 3, 1) |
| Ex(19, 3, 1) | Ey(19, 3, 1) | Ez(19, 3, 1) |
| Hx(19, 3, 1) | Hy(19, 3, 1) | Hz(19, 3, 1) |
| Ex(20, 3, 1) | Ey(20, 3, 1) | Ez(20, 3, 1) |
| Hx(20, 3, 1) | Hy(20, 3, 1) | Hz(20, 3, 1) |

DATA COMPRESSION →

| | | |
|---|---|---|
| Ex(1, 3, 1) | Ey(1, 3, 1) | Ez(1, 3, 1) |
| Hx(1, 3, 1) | Hy(1, 3, 1) | Hz(1, 3, 1) |
| Ex(4, 3, 1) | Ey(4, 3, 1) | Ez(4, 3, 1) |
| Hx(4, 3, 1) | Hy(4, 3, 1) | Hz(4, 3, 1) |
|  | Ey(5, 3, 1) |  |
|  | Hy(5, 3, 1) |  |
|  | Ey(6, 3, 1) |  |
|  | Hy(6, 3, 1) |  |
| Ex(7, 3, 1) | Ey(7, 3, 1) | Ez(7, 3, 1) |
| Hx(7, 3, 1) | Hy(7, 3, 1) | Hz(7, 3, 1) |
| Ex(11, 3, 1) | Ey(11, 3, 1) | Ez(11, 3, 1) |
| Hx(11, 3, 1) | Hy(11, 3, 1) | Hz(11, 3, 1) |
|  | Ey(12, 3, 1) |  |
|  | Hy(12, 3, 1) |  |
| Ex(13, 3, 1) | Ey(13, 3, 1) | Ez(13, 3, 1) |
| Hx(13, 3, 1) | Hy(13, 3, 1) | Hz(13, 3, 1) |
| Ex(20, 3, 1) | Ey(20, 3, 1) | Ez(20, 3, 1) |
| Hx(20, 3, 1) | Hy(20, 3, 1) | Hz(20, 3, 1) |

STORE DATA BECAUSE DATA IS ON ANALYSIS BORDER
STORE DATA BECAUSE DATA IS ON MEDIA BORDER
STORE ONLY Y-AXIS DATA BECAUSE DATA IS ON MEDIA BORDER
STORE DATA BECAUSE DATA IS ON MEDIA BORDER
STORE DATA BECAUSE DATA IS ON MEDIA BORDER

FIG.13

STORE DATA BECAUSE DATA IS ON CIRCUIT-ELEMENT BORDER

STORE DATA BECAUSE DATA IS ON MEDIA BORDER

STORE DATA BECAUSE DATA IS ON ANALYSIS BORDER

| | | |
|---|---|---|
| Ex(1, 2, 1) | Ey(1, 2, 1) | Ez(1, 2, 1) |
| Hx(1, 2, 1) | Hy(1, 2, 1) | Hz(1, 2, 1) |
| Ex(2, 2, 1) | Ey(2, 2, 1) | Ez(2, 2, 1) |
| Hx(2, 2, 1) | Hy(2, 2, 1) | Hz(2, 2, 1) |
| Ex(3, 2, 1) | Ey(3, 2, 1) | Ez(3, 2, 1) |
| Hx(3, 2, 1) | Hy(3, 2, 1) | Hz(3, 2, 1) |
| Ex(4, 2, 1) | Ey(4, 2, 1) | Ez(4, 2, 1) |
| Hx(4, 2, 1) | Hy(4, 2, 1) | Hz(4, 2, 1) |
| Ex(5, 2, 1) | Ey(5, 2, 1) | Ez(5, 2, 1) |
| Hx(5, 2, 1) | Hy(5, 2, 1) | Hz(5, 2, 1) |
| Ex(6, 2, 1) | Ey(6, 2, 1) | Ez(6, 2, 1) |
| Hx(6, 2, 1) | Hy(6, 2, 1) | Hz(6, 2, 1) |
| Ex(7, 2, 1) | Ey(7, 2, 1) | Ez(7, 2, 1) |
| Hx(7, 2, 1) | Hy(7, 2, 1) | Hz(7, 2, 1) |
| Ex(8, 2, 1) | Ey(8, 2, 1) | Ez(8, 2, 1) |
| Hx(8, 2, 1) | Hy(8, 2, 1) | Hz(8, 2, 1) |
| Ex(9, 2, 1) | Ey(9, 2, 1) | Ez(9, 2, 1) |
| Hx(9, 2, 1) | Hy(9, 2, 1) | Hz(9, 2, 1) |
| Ex(10, 2, 1) | Ey(10, 2, 1) | Ez(10, 2, 1) |
| Hx(10, 2, 1) | Hy(10, 2, 1) | Hz(10, 2, 1) |
| Ex(11, 2, 1) | Ey(11, 2, 1) | Ez(11, 2, 1) |
| Hx(11, 2, 1) | Hy(11, 2, 1) | Hz(11, 2, 1) |
| Ex(12, 2, 1) | Ey(12, 2, 1) | Ez(12, 2, 1) |
| Hx(12, 2, 1) | Hy(12, 2, 1) | Hz(12, 2, 1) |
| Ex(13, 2, 1) | Ey(13, 2, 1) | Ez(13, 2, 1) |
| Hx(13, 2, 1) | Hy(13, 2, 1) | Hz(13, 2, 1) |
| Ex(14, 2, 1) | Ey(14, 2, 1) | Ez(14, 2, 1) |
| Hx(14, 2, 1) | Hy(14, 2, 1) | Hz(14, 2, 1) |
| Ex(15, 2, 1) | Ey(15, 2, 1) | Ez(15, 2, 1) |
| Hx(15, 2, 1) | Hy(15, 2, 1) | Hz(15, 2, 1) |
| Ex(16, 2, 1) | Ey(16, 2, 1) | Ez(16, 2, 1) |
| Hx(16, 2, 1) | Hy(16, 2, 1) | Hz(16, 2, 1) |
| Ex(16, 2, 1) | Ey(16, 2, 1) | Ez(16, 2, 1) |
| Hx(16, 2, 1) | Hy(16, 2, 1) | Hz(16, 2, 1) |
| Ex(17, 2, 1) | Ey(17, 2, 1) | Ez(17, 2, 1) |
| Hx(17, 2, 1) | Hy(17, 2, 1) | Hz(17, 2, 1) |
| Ex(18, 2, 1) | Ey(18, 2, 1) | Ez(18, 2, 1) |
| Hx(18, 2, 1) | Hy(18, 2, 1) | Hz(18, 2, 1) |
| Ex(19, 2, 1) | Ey(19, 2, 1) | Ez(19, 2, 1) |
| Hx(19, 2, 1) | Hy(19, 2, 1) | Hz(19, 2, 1) |
| Ex(20, 2, 1) | Ey(20, 2, 1) | Ez(20, 2, 1) |
| Hx(20, 2, 1) | Hy(20, 2, 1) | Hz(20, 2, 1) |

DATA COMPRESSION

| | | |
|---|---|---|
| Ex(1, 6, 1) | Ey(1, 6, 1) | Ez(1, 6, 1) |
| Hx(1, 6, 1) | Hy(1, 6, 1) | Hz(1, 6, 1) |
| Ex(4, 6, 1) | Ey(4, 6, 1) | Ez(4, 6, 1) |
| Hx(4, 6, 1) | Hy(4, 6, 1) | Hz(4, 6, 1) |
| Ex(5, 6, 1) | Ey(5, 6, 1) | Ez(5, 6, 1) |
| Hx(5, 6, 1) | Hy(5, 6, 1) | Hz(5, 6, 1) |
| Ex(13, 6, 1) | Ey(13, 6, 1) | Ez(13, 6, 1) |
| Hx(13, 6, 1) | Hy(13, 6, 1) | Hz(13, 6, 1) |
| Ex(20, 6, 1) | Ey(20, 6, 1) | Ez(20, 6, 1) |
| Hx(20, 6, 1) | Hy(20, 6, 1) | Hz(20, 6, 1) |

STORE DATA BECAUSE DATA IS ON ANALYSIS BORDER

STORE DATA BECAUSE DATA IS ON MEDIA BORDER

ANALYZING APPARATUS AND DATA STORAGE METHOD

CROSS-REFERENCE TO RELATED APPLICATION

This application is based upon and claims the benefit of priority of the prior Japanese Patent Application No. 2008-260175, filed on Oct. 6, 2008, the entire contents of which are incorporated herein by reference.

FIELD

The embodiments discussed herein are directed to an analyzing apparatus that stores result data that is calculated as a result of analysis using a simulation and restores the result data. The embodiments discussed herein are further directed to a method of storing the result data.

BACKGROUND

A technology that uses a simulation to calculate a three-dimensional model having equally spaced discrete points has been used for the analysis of an electromagnetic wave or the like. A finite-difference time-domain (FDTD) method is a widely known way of analyzing three-dimensional electromagnetic waves. In the method, Maxwell's equations are solved using a difference method with respect to space and time. Because discrete points in an electric field and discrete points in a magnetic field are calculated using change of time in the FDTD method, all the results are stored as result data (i.e., result data on "space×storage").

Suppose, for example, a case where the range of a model to be analyzed has 100×100×100 discrete points, and the range is calculated with 10-femtosecond (fsec) increments for 10 nanoseconds (nsec). Then, the number of pieces of data to be stored becomes 100×100×100×1,000,000 steps, which is equal to $10^{12}$ pieces.

The result data on each point is formed with X, Y, Z coordinates in the electric field and X, Y, Z coordinates in the magnetic field. If each data is float-type 4-byte data, then 4 bytes×3 (directions)×2 (electric field/magnetic field) or 24 bytes in total is required to store the result data on each point. Therefore, 24×$10^{12}$ bytes or 24 terabytes (T bytes), which is calculated from the number of the pieces of the discrete data and the required data area for each point, is required to store all the calculated result data.

It is clear from the calculation that a remarkably large resource is required to store all the calculated result data. As such a large resource is required, technology has been used to skip a part of the target data to be analyzed and then analyze the post-skipping data or technology has been used to set a skipping condition concerning the calculated result data to be skipped before the analysis.

Japanese Laid-open Patent Publication No. 05-73649 discloses a technology that analyzes post-skipping data by skipping a part of the target data to be analyzed by referring to a feature and level of importance. Japanese Laid-open Patent Publication No. 05-282407 discloses a technology that sets the skipping condition by combining adjacent elements, thereby skipping the calculated result data.

The problem with the technology that analyzes the post-skipping data is that, because the target data to be analyzed is subjected to data skipping, accuracy of the analyzing process decreases. Furthermore, the problem with the technology that sets the skipping condition is that some pieces of the result data (e.g., data on a border between different media) cannot be restored properly.

SUMMARY

According to an aspect of the invention, an analyzing apparatus includes a result-data storing unit that determines whether result data that is calculated as a result of analysis is restorable by linear interpolation and, if the result data is determined to be unrestorable by linear interpolation, stores the result data in a predetermined storage unit; and a data restoring unit that reads the result data from the storage unit and performs linear interpolation using the result data that is acquired from the storage unit, thereby restoring the result data.

The object and advantages of the invention will be realized and attained by means of the elements and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIG. 3 is a schematic diagram that explains media data;

FIG. 4 is a schematic diagram that explains circuit-element data;

FIGS. 11 to 13 are schematic diagrams that explain data to be stored;

DESCRIPTION OF EMBODIMENTS

Exemplary embodiments of the present invention are described in detail below with reference to the accompanying drawings.

[a] First Embodiment

In the following description of a first embodiment according to the present invention, the configuration of and the processing performed by an electromagnetic-wave analyzing apparatus 10 according to the first embodiment and the effects of the first embodiment are described, in that order. The electromagnetic-wave analyzing apparatus 10 in the first embodiment analyzes electromagnetic waves using a simulation based on an FDTD method.

[Configuration of Electromagnetic-wave Analyzing Apparatus]

Figures 1, 2:
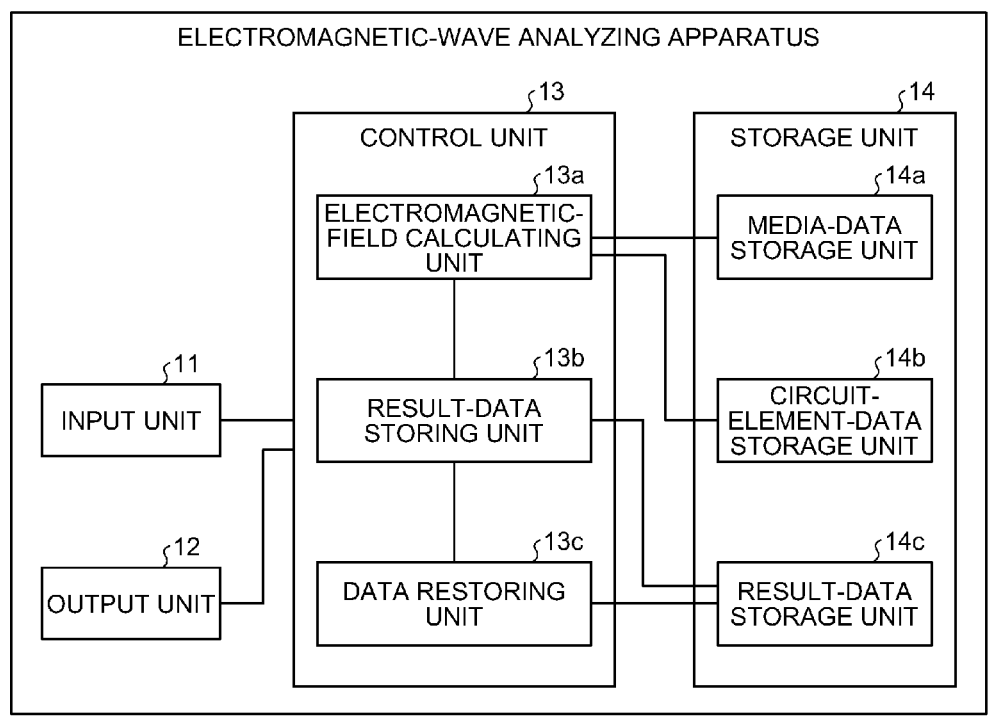
FIG. 1 is a block diagram of an electromagnetic-wave analyzing apparatus according to a first embodiment of the present invention.
FIG. 2 is a schematic diagram that illustrates an input process for specifying a range of an electromagnetic field to be stored.
Figure 5:
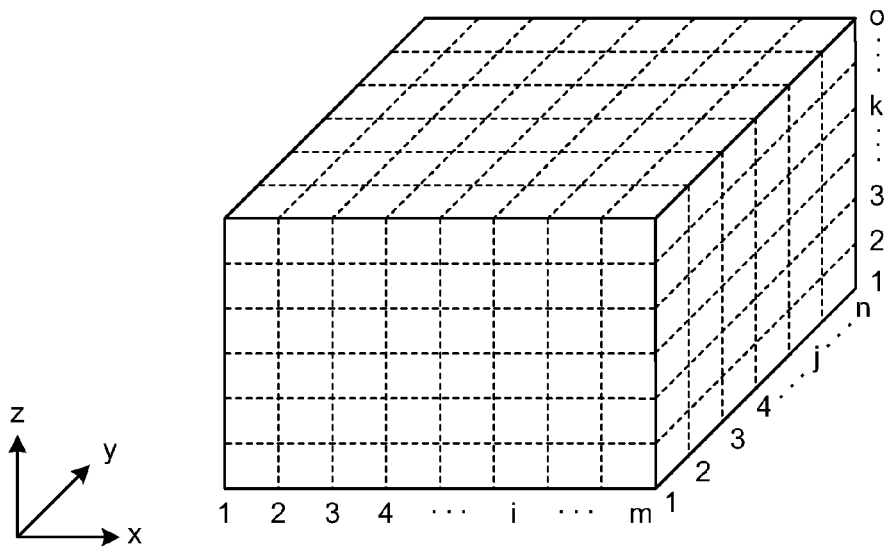
FIG. 5 is a schematic diagram of an example of data that is calculated using an FDTD method.
Figure 6:
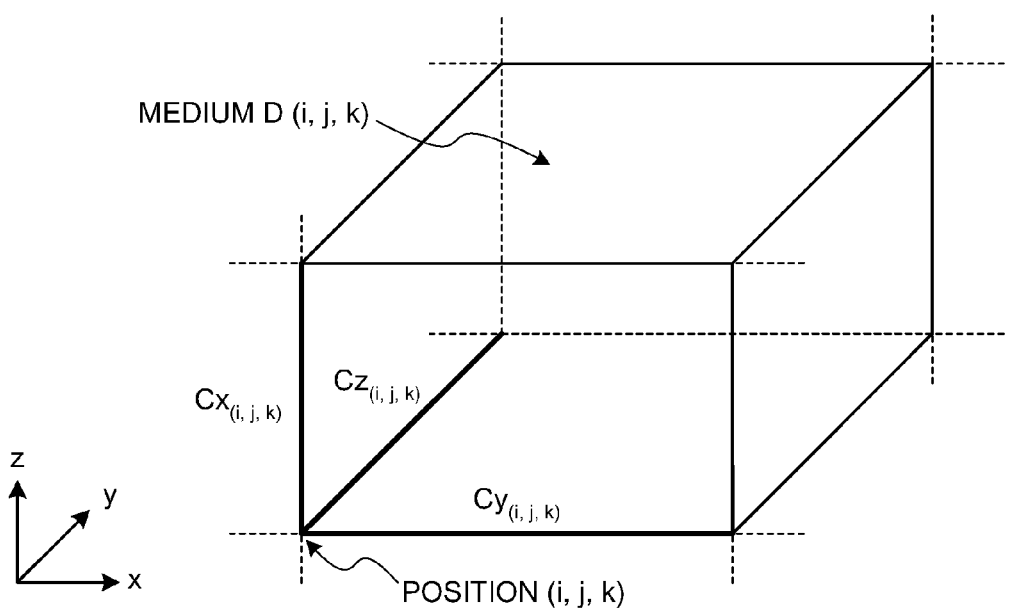
FIG. 6 is a schematic diagram that explains data on a medium and data on a circuit element.

The configuration of the electromagnetic-wave analyzing apparatus 10 according to the first embodiment is described with reference to FIG. 1. FIG. 1 is a block diagram of the electromagnetic-wave analyzing apparatus 10 according to the first embodiment. FIG. 2 is a schematic diagram that illustrates an input process for specifying the range of an electromagnetic field to be stored. FIG. 3 is a schematic diagram that explains media data. FIG. 4 is a schematic diagram that explains circuit-element data. FIG. 5 is a schematic diagram of an example of data that is calculated using the FDTD method. FIG. 6 is a schematic diagram that explains data on a medium and data on a circuit element.

Figure 7:
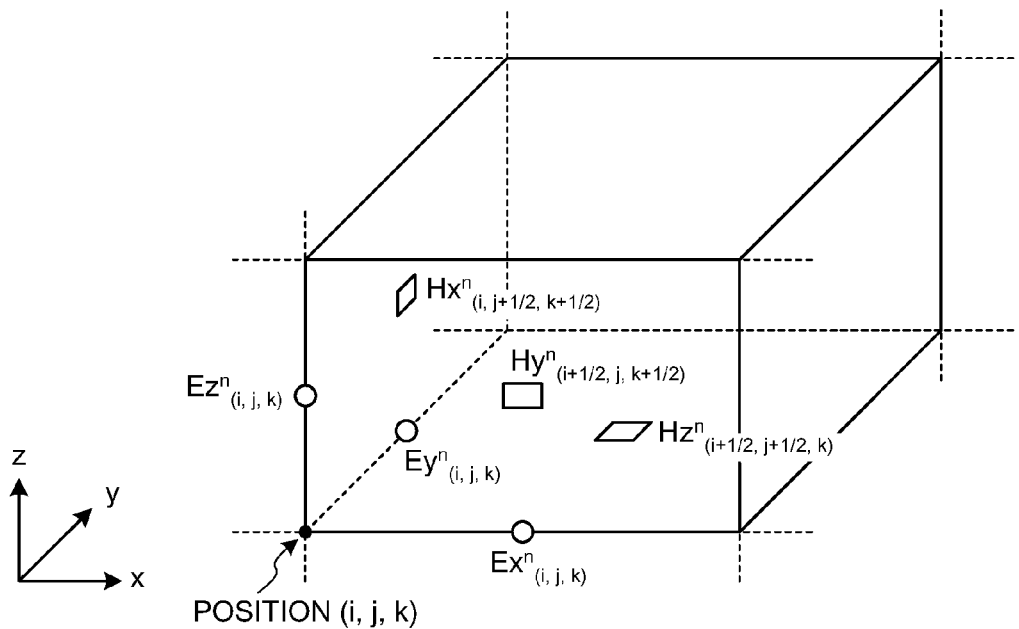
FIG. 7 is a schematic diagram that explains data on an electric field and data on a magnetic field.
Figure 8:
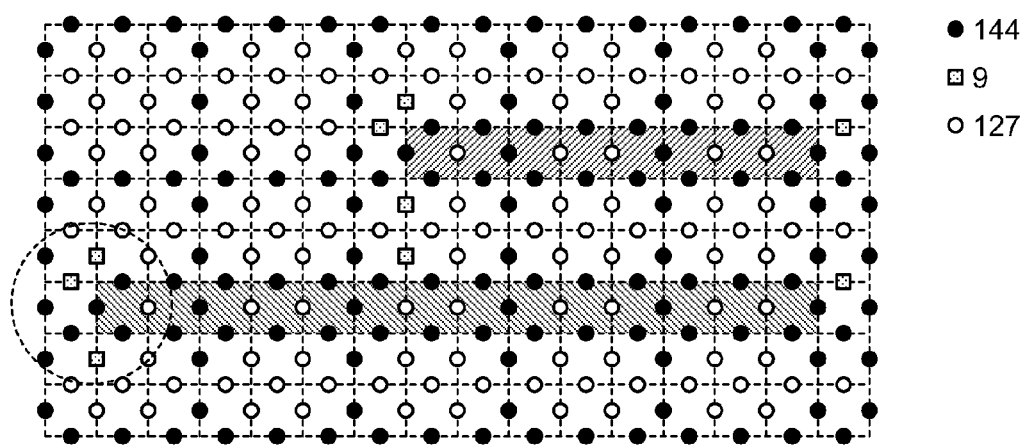
FIG. 8 is a schematic diagram that explains a result-data storing process.
Figure 9:
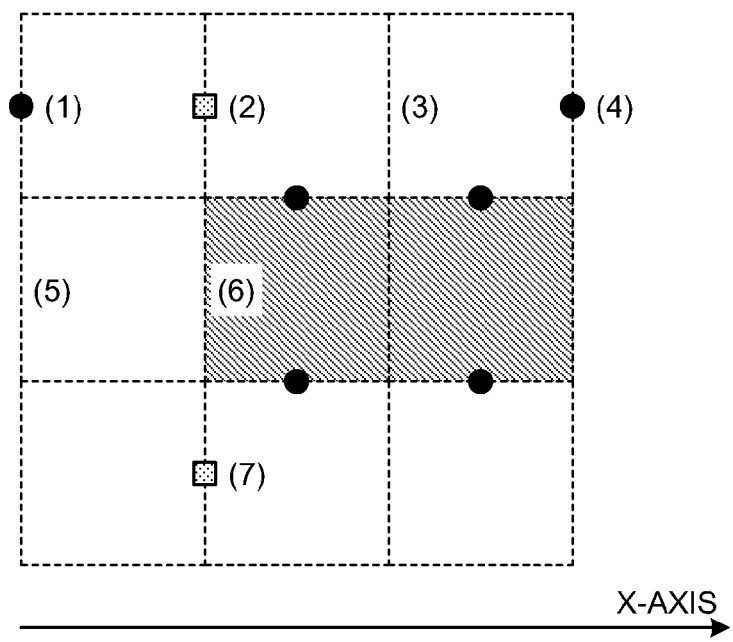
FIG. 9 is a schematic diagram that explains data that is not to be skipped during the result-data storing process.
Figure 10:
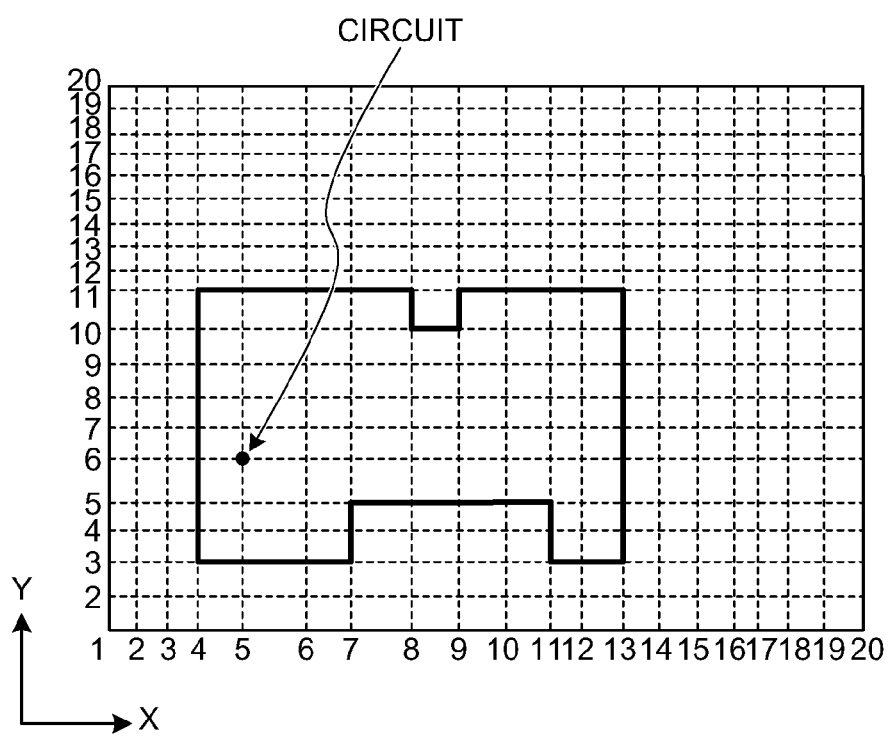
FIG. 10 is a plain view of an example of the FDTD calculated data.
Figure 14:
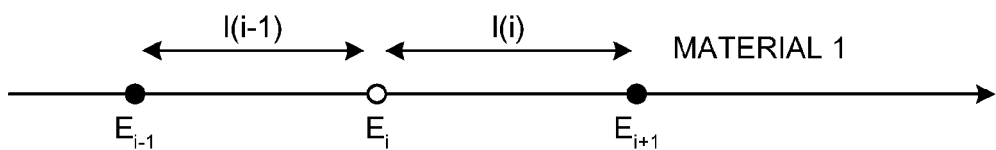
FIGS. 14 to 16 are schematic diagrams that explain a data restoring process.
Figure 15:
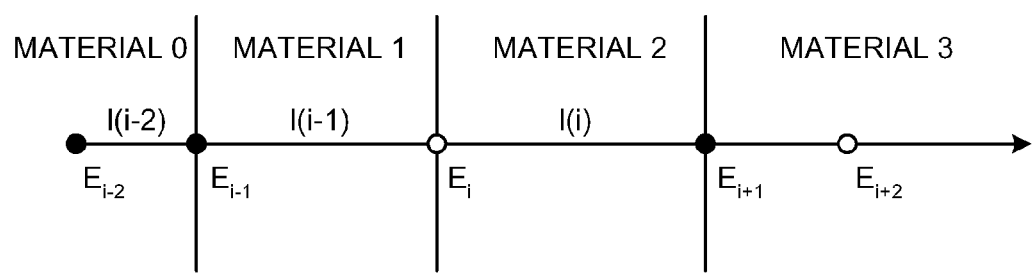
Figure 16:
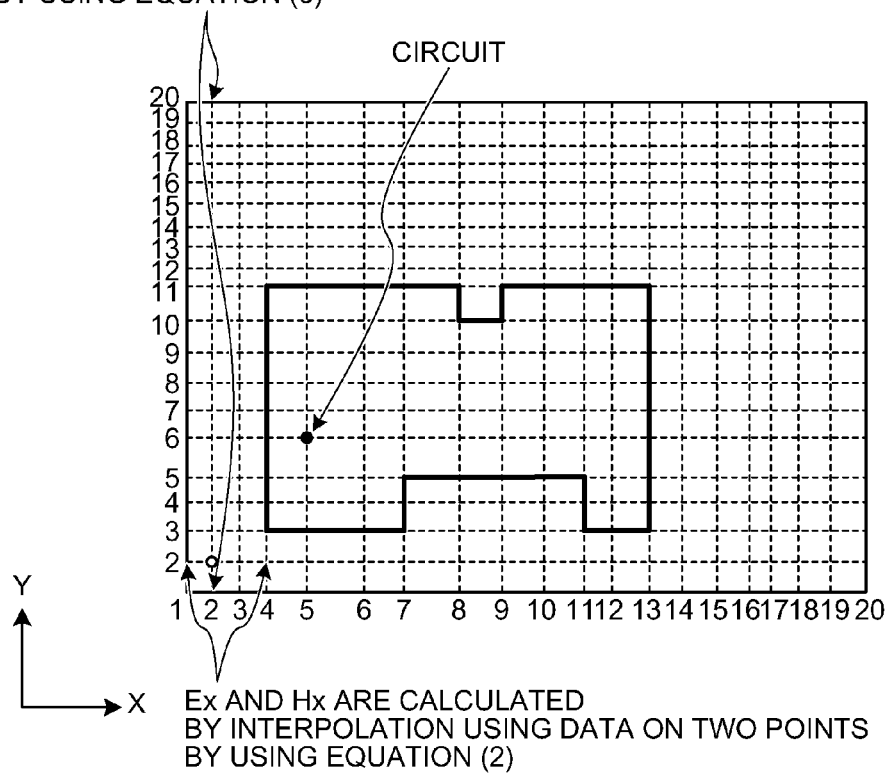
Figure 17:
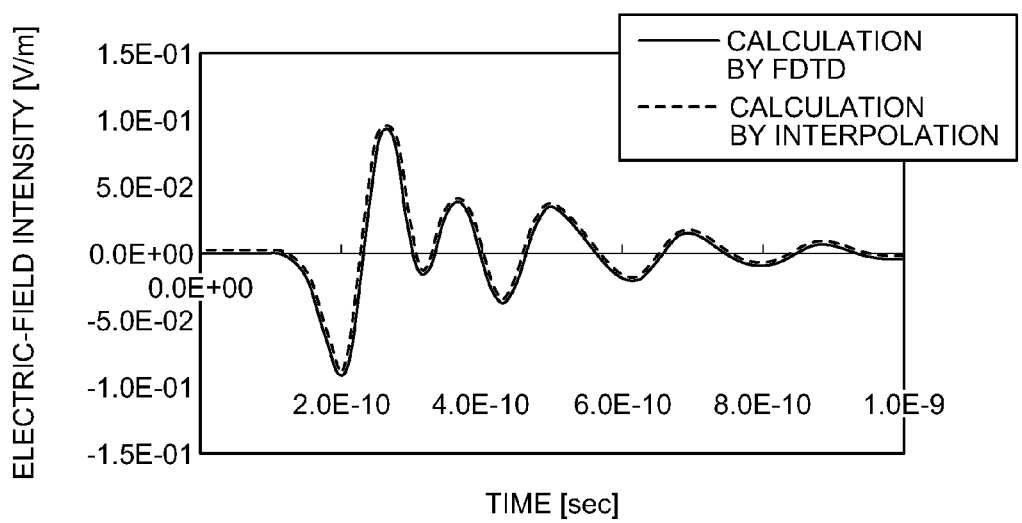
FIG. 17 is a schematic diagram that explains accuracy of restored data.

FIG. 7 is a schematic diagram that explains data on an electric field and data on a magnetic field. FIG. 8 is a schematic diagram that explains a result-data storing process. FIG. 9 is a schematic diagram that explains data that is not to be skipped during the result-data storing process. FIG. 10 is a plain view of an example of the FDTD calculated data. FIGS. 11 to 13 are schematic diagrams that explain data to be stored. FIGS. 14 to 16 are schematic diagrams that explain a restoring process. FIG. 17 is a schematic diagram that explains the accuracy of the restored data.

As illustrated in FIG. 1, the electromagnetic-wave analyzing apparatus 10 includes an input unit 11, an output unit 12, a control unit 13, and a storage unit 14. Those units are described in detail below.

The input unit 11 includes a keyboard, a mouse, or a microphone. The input unit 11 is used to receive various data, such as the initial data to be calculated, range of the electromagnetic field to be stored, skipping interval, and accuracy coefficient. The input unit 11 receives the minimum number and the maximum number of each x axis, y axis, and z axis, as illustrated in FIG. 2, so that the range of the electromagnetic field to be stored is specified.

In the example illustrated in FIG. 5, if the range to be stored includes all the calculated data, the input unit 11 is given the x-axis minimum number "1", the y-axis minimum number "1", the z-axis minimum number "1", the x-axis maximum number "m", the y-axis maximum number "n", and the z-axis maximum number "o".

The output unit 12 includes a monitor (e.g., a display or a touch panel) or a speaker. The output unit 12 displays stored result data and restored data.

In the electromagnetic-wave analyzing apparatus 10, when the output unit 12 displays the stored result data, a user checks the displayed result data and using the input unit 11 selects, for example, a range having a strong electric field or a strong magnetic field as the range to be analyzed in detail. The electromagnetic-wave analyzing apparatus 10 restores the result data within the selected range and outputs the restored data to the output unit 12.

The storage unit 14 stores therein data and computer programs used in various processes performed by the control unit 13. The storage unit 14 includes a media-data storage unit 14a, a circuit-element-data storage unit 14b, and a result-data storage unit 14c.

The media-data storage unit 14a stores therein information on media of the initial data to be calculated. As illustrated in FIG. 3, more particularly, the media-data storage unit 14a stores therein the "number of materials" indicative of the number of materials that are included in the initial data, the "material number" that is unique to each material, the "material name" indicative of the name of the material, "property values" such as permittivity and conductivity, and the "material number corresponding to each set of coordinates".

The circuit-element-data storage unit 14b stores therein information on circuit elements in the initial data to be calculated. As illustrated in FIG. 4, more particularly, the circuit-element-data storage unit 14b stores therein the "number of circuit elements" indicative of the number of circuit elements that are included in the initial data, the "circuit element number" that is unique to each circuit element, the "circuit element name" indicative of the name of the circuit element, and the "circuit element type" indicative of the type of the circuit element (e.g., resistor, capacitor, and coil).

As illustrated in FIG. 4, the circuit-element-data storage unit 14b stores therein the "value" indicative of the properties of the circuit element (e.g., resistance value) and the "direction and position of the circuit element" indicative of direction and position with respect to the x axis, the y axis, and the z axis.

The result-data storage unit 14c stores therein the post-skipping result data contained in the result data that is calculated as a result of the electromagnetic-field analysis. More particularly, the result-data storage unit 14c stores therein the post-result data that is generated by data skipping performed by a later-described result-data storing unit 13b (as described later with reference to FIGS. 11 to 13).

The control unit 13 includes an internal memory that stores therein various computer programs and various data and performs various processes by executing the computer programs using the data. More particularly, the control unit 13 includes an electromagnetic-field calculating unit 13a, the result-data storing unit 13b, and a data restoring unit 13c.

The electromagnetic-field calculating unit 13a performs calculations using the initial data based on the FDTD method in order to analyze the electromagnetic field. More particularly, upon receiving an instruction to start the calculation for the electromagnetic-field analysis, the control unit 13 performs the FDTD calculation using the initial data on the whole gridded space that is received from the input unit 11 and sends the calculated result data to the result-data storing unit 13b.

The calculation used in the electromagnetic-field analysis is described in detail in the following. In the FDTD method, a space in the electromagnetic field is calculated at equal temporal intervals. Temporal intervals satisfying the Courant condition are used to obtain a stable solution.

As illustrated in FIG. 5, the initial data to be calculated is discrete data equally spaced in the orthogonal grid shape. The grid-shaped x-axis coordinates are numbered 1, 2, 3, . . . , i, . . . , and m; the y-axis coordinates are numbered 1, 2, 3, . . . , j, . . . , and n; and the z-axis coordinates are numbered 1, 2, 3, . . . , k, . . . , and o.

The media and the circuit elements included in the initial data as illustrated in the example of FIG. 5 are described in the following. As illustrated in FIG. 6, a medium within a range from a position (i, j, k) to a position (i+1, j+1, k+1) is referred to as medium D (i, j, k).

There are three circuit elements in the example illustrated in FIG. 6, including a circuit element Cx (i, j, k) that is arranged between a position (i, j, k) and a position (i+1, j, k) in a connected state; a circuit element Cy (i, j, k) that is arranged between the position (i, j, k) and a position (i, j+1, k) in the connected state; and a circuit element Cz (i, j, k) that is arranged between the position (i, j, k) and a position (i, j, k+1) in the connected state.

Data on the electric field and data on the magnetic field are described in the following. As illustrated in FIG. 7, the electric field at the n-th time-step is denoted by $E^n$. The electric field at the position (i, j, k) is resolved to $Ex^n$ (i, j, k) as the component with respect to the x axis, $Ey^n$ (i, j, k) as the component with respect to the y axis, and $Ez^n$ (i, j, k) as the component with respect to the z axis. There is a shift in the time step between the magnetic field H and the electric field E of 0.5 of the time step and a shift in position between the magnetic field H and the electric field E of 0.5. The magnetic field H is resolved to $Hx^{n-1/2}(i, j+½, k+½)$, $Hy^{n-1/2}(i+½, j, k+½)$, and $Hz^{n-1/2}(i+½, j+½, k)$.

The result-data storing unit 13b determines whether linear interpolation can be used to restore the result data that is calculated as a result of the analysis. If the result-data storing unit 13b determines that the result data is not restorable by linear interpolation (i.e., the result data is on a media border, an analysis border, or a circuit-element border), the result-data storing unit 13b stores the result data in the result-data storage unit 14c.

More particularly, upon receiving the result data from the electromagnetic-field calculating unit 13a, the result-data storing unit 13b determines whether the received result data is on an edge of the target range to be analyzed (hereinafter, "analysis border"). If the result-data storing unit 13b determines the received result data is on the analysis border, the result-data storing unit 13b stores the result data in the result-data storage unit 14c because data on the analysis border is unrestorable by linear interpolation.

If the received result data is not on the analysis border, the result-data storing unit 13b determines whether the received result data is on a border between different materials (hereinafter, "media border"). More particularly, the result-data storing unit 13b reads both the media data corresponding to the coordinates of the result data and the media data corresponding to the cell adjacent to the result data from the media-data storage unit 14a. The result-data storing unit 13b then determines whether the material number of the result data is different from the material number of the adjacent cell.

The determinations of the analysis border and the media border are described with reference to FIG. 8. In the example illustrated in FIG. 8, the material of the shaded portion is different from the material of the other portion. Black circles indicate positions of cells necessary to store. White circles indicate positions of cells unnecessary to store. Squares with dots indicate data necessary to store because the media border is present within the accuracy coefficient (described in detail later with reference to FIG. 9).

In the example illustrated in FIG. 8, the result data on the edge of the target range in the electromagnetic field (i.e., 8 black circles on each short side and 16 black circles on each long side, as illustrated in FIG. 8) is stored in the result-data storage unit 14c as the result data on the analysis border. Furthermore, the result data on the borders between the shaded portion and the other portion is stored in the result-data storage unit 14c as the result data on the media border. The black circles other than those on the analysis border and those on the media border are selected based on the skipping interval as the result data to be stored. (In the example illustrated in FIG. 8, the skipping interval is set to 2).

Thus, if result data is determined to be on the media border, the result-data storing unit 13b stores the result data in the result-data storage unit 14c. If result data is determined to be not on the media border, the result-data storing unit 13b then determines whether the result data is on a border on which a circuit element is arranged (hereinafter, "circuit-element border"). More particularly, the result-data storing unit 13b determines whether there is a circuit element corresponding to the coordinates of the result data by referring to the circuit-element-data storage unit 14b.

If result data is determined to be on the circuit-element border, the result-data storing unit 13b stores the result data in the result-data storage unit 14c. If the result data is determined to be not on the circuit-element border, the result-data storing unit 13b performs a skipping determination process to determine whether the result data is to be skipped.

In the skipping determination process, the result-data storing unit 13b determines whether the result data is to be skipped according to the skipping interval. If the result data is determined not to be skipped, the result-data storing unit 13b determines whether the media border is present within the accuracy coefficient.

The determination of the accuracy coefficient is described with reference to FIG. 9. In the example illustrated in FIG. 9, the material of the shaded portion is different from the material of the other portion. The black circles indicate positions of cells necessary to store. The squares with dots indicate data necessary to store because the media border is present within the accuracy coefficient. The accuracy coefficient is set to "1" in the example illustrated in FIG. 9.

In the example illustrated in FIG. 9, even when the linear interpolation is performed using data at points (1) and (4), the electric field and the magnetic field at a point (2) cannot be restored with a high enough accuracy because the data at a point (6) has a different medium. Therefore, it is necessary to store data on a cell (cells, if the accuracy coefficient is two or more) adjacent to a cell having a different medium. For this reason, the electric field and the magnetic field at the point (2), which is adjacent to a cell having a different media, is stored. Data on a point (7), which is adjacent to a cell having a different medium, is stored for the same reason.

The accuracy coefficient is set to 1 in the example illustrated in FIG. 9. As the accuracy coefficient increases, the amount of data to be stored increases and the data compression ratio decreases. The accuracy coefficient is variable from 0 to the upper limit of the number of cells.

If it is determined that the media border is present within the accuracy coefficient, the result-data storing unit 13b determines that the result data is not to be skipped and stores the result data in the result-data storage unit 14c. If is determined that the result data is to be skipped according to the skipping interval or the media border is not present within the accuracy coefficient, the result-data storing unit 13b determines that the result data is to be skipped and does not store the result data in the result-data storage unit 14c.

An example of data to be stored is described with reference to FIGS. 10 to 13. FIG. 10 illustrates a plane with Z axis=1 based on the FDTD calculated data. As illustrated in FIG. 10, the whole grid space is subjected to the calculation for the electric field/magnetic field analysis. The electromagnetic-wave analyzing apparatus 10, as illustrated in FIGS. 11 to 13, skips a part of the calculated data and stores therein the post-skipping data.

The data to be stored is described in detail with reference to the example illustrated in FIG. 10. The electromagnetic-wave analyzing apparatus 10 stores therein all the data on a first line where Y=1 and Z=1 running in the X-axis direction. This is because the first line is the analysis border. In contrast, the electromagnetic-wave analyzing apparatus 10 stores therein a part of data on a second line where Y=2 and Z=1 after compressing the data on the second line in a manner as illustrated in FIG. 11.

In the example illustrated in FIG. 10 and FIG. 11, although the medium is unchanged from a point (1, 2, 1) to a point (20, 2, 1) in the result data on the second line with Y=2 and Z=1, four points (4, 2, 1), (7, 2, 1), (11, 2, 1), and (13, 2, 1) are located near the media border in the X-axis direction. Therefore, only X-axis data on the four points is stored as the result data unrestorable by linear interpolation.

The electromagnetic-wave analyzing apparatus 10 stores therein a part of data on a third line where Y=3 and Z=1 after compressing the data on the third line in a manner as illustrated in FIG. 12. More particularly, the electromagnetic-wave analyzing apparatus 10 stores therein X-axis data and Z-axis data on four points (4, 3, 1), (7, 3, 1), (11, 3, 1), and (13, 3, 1) that are located on the media border. The electromagnetic-wave analyzing apparatus 10 stores therein Y-axis data on all the points of the third line with Y=3 and Z=1. This is because the line from a point (1, 3, 1) to a point (20, 3, 1) is the media border.

The electromagnetic-wave analyzing apparatus 10 stores therein a part of data on a fourth line with Y=6 and Z=1 after compressing the data on the fourth line in a manner as illustrated in FIG. 13. More particularly, the electromagnetic-wave analyzing apparatus 10 stores therein X-axis data, Y-axis data, and Z-axis data on two points (4, 6, 1) and (13, 6, 1) that are located on the media border and a point (5, 6, 1) that is located on a circuit element.

As a result, from among 20×20×6 or 2400 pieces of data on the plane with Z=1, 36 (borders)×6+30 (X direction)×2+20 (Y direction)×2+24 (Z direction)×2+1 (circuit element)×6 or 370 pieces of data are stored. That is, the data compression rate is 1/6.5.

The data restoring unit 13c reads the result data that is stored by the result-data storing unit 13b and performs linear interpolation using the acquired result data, thereby restoring the result data. More particularly, upon receiving an instruction to start the restoring, the data restoring unit 13c determines whether a target point to be restored is on the media border. If the target point is not on the media border (assume that the target point is $E_i$ in the example illustrated in FIG. 14), the data restoring unit 13c restores the result data using Equation (1):

$$E_i = E_{i-1} + \gamma(l(i-1)/l(i)) \cdot (E_{i+1} - E_{i-1}) \quad (1)$$

If the target point is on the media border, as illustrated in FIG. 15, the data restoring unit 13c restores the result data by reading the result data from the data restoring unit 13c. After that, the data restoring unit 13c repeats the restoring process until all the x-axis data, the y-axis data, and the z-axis data on the specified range in both the electric field and the magnetic field is restored.

The restoring process is described in detail with reference to the example illustrated in FIG. 16. In the example illustrated in FIG. 16, as for data where Y=2 and Z=1, the electromagnetic-wave analyzing apparatus 10 restores Ex(2, 2, 1) using Equation (1) that is described above and Equation (2) that is described below:

$$Ex(2, 2, 1) = Ex(1, 2, 1) + 11/(11+12) * 11/12(Ex(4, 2, 1) + Ex(2, 2, 1)) \quad (2)$$

where 11 is the distance between the point (1, 2, 1) and the point (2, 2, 1), and 12 is the distance between the point (2, 2, 1) and the point (4, 2, 1). In the example illustrated in FIG. 16, because the data where Y=1 and Z=1 are on the analysis border, all the data where Y=1 and Z=1 is stored in the result-data storage unit 14c. Therefore, the electromagnetic-wave analyzing apparatus 10 restores the result data by reading the result data from the result-data storage unit 14c.

The electromagnetic-wave analyzing apparatus 10 restores Ey(2, 2, 1) using Equation (1), which is described above and Equation (3), which is described below:

$$Ey(2,2,1) = Ey(2, 1, 1) + 13/(13+14) * 13/14(Ey(2, 20, 1) - Ey(2, 2, 1)) \quad (3)$$

where 13 is the distance between the point (2, 1, 1) and the point (2, 2, 1), and 14 is distance between the point (2, 2, 1) and the point (2, 20, 1).

In this manner, the electromagnetic-wave analyzing apparatus 10 restores a series of points having the same medium using data on a part of the points that is stored in the result-data storage unit 14c by using Equation (1). The positions of the stored data depend on the model, and the positions can be found by the rules similar to the conditions concerning the storing. It means that it is unnecessary to store therein the positions of the data that is used for the restoring. More particularly, the positions are found by the model, the skipping interval, and the accuracy coefficient.

The restored data is illustrated in FIG. 17. As illustrated in FIG. 17, the restored data (indicated by a broken line in the example illustrated in FIG. 17) substantially matches the result data that is calculated based on the FDTD method (indicated by a continuous line in the example illustrated in FIG. 17).

[Processing Performed by Electromagnetic-Wave Analyzing Apparatus]

Figure 18:
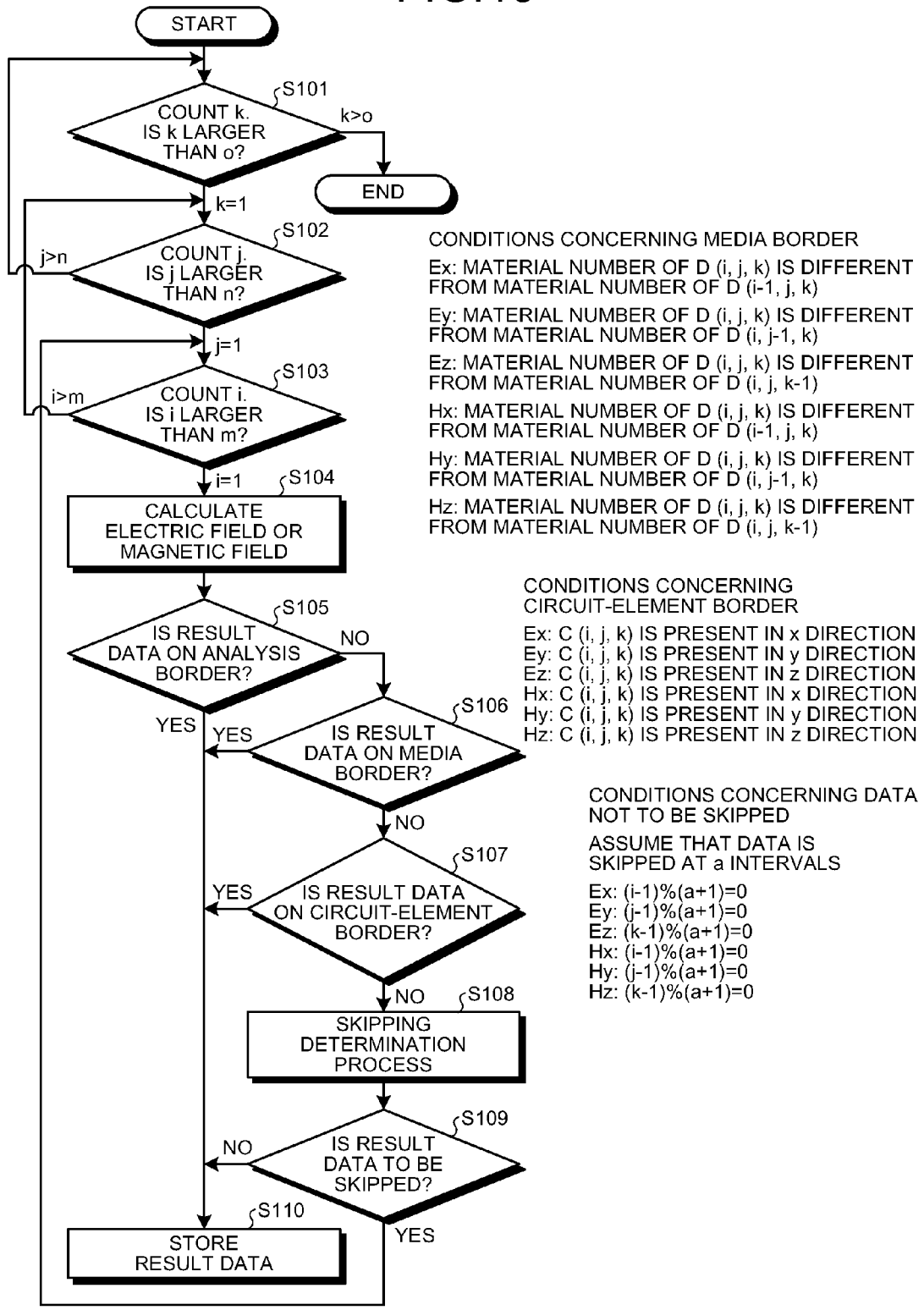
FIG. 18 is a flowchart of the result-data storing process performed by the electromagnetic-wave analyzing apparatus according to the first embodiment.
Figure 19:
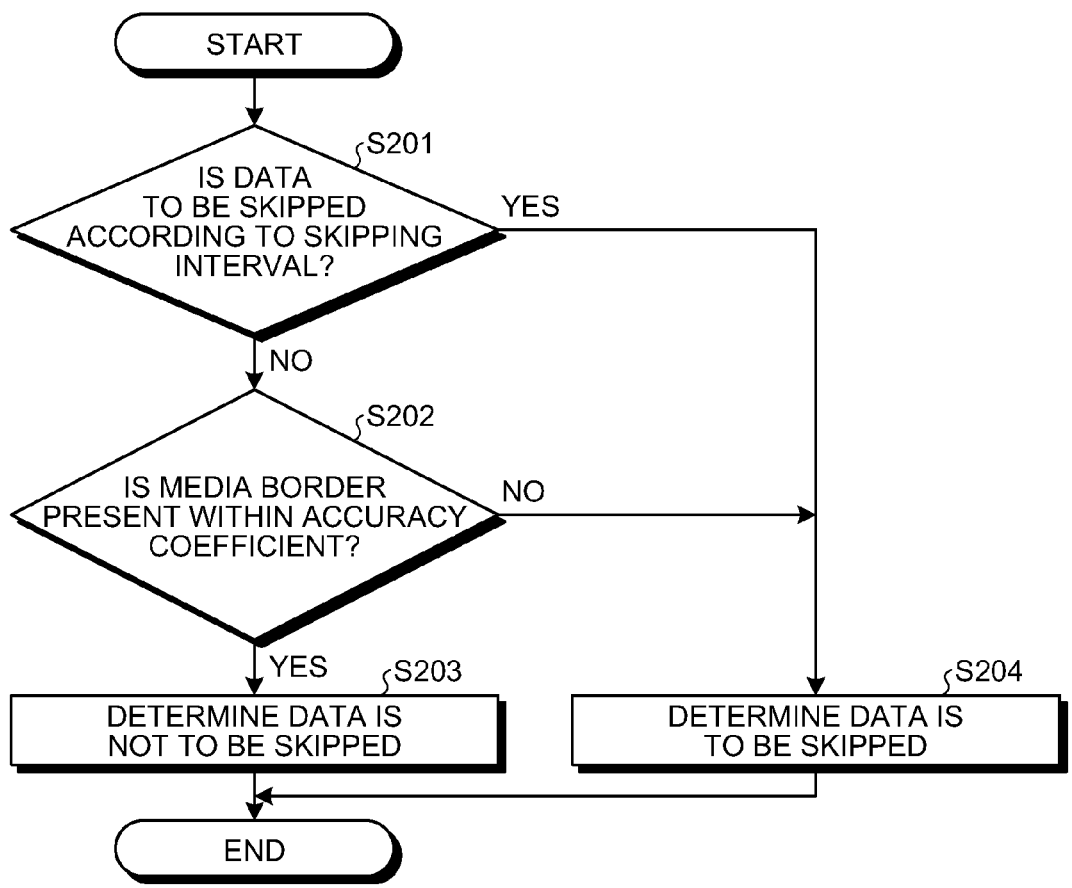
FIG. 19 is a flowchart of a skipping determination process performed by the electromagnetic-wave analyzing apparatus according to the first embodiment.
Figure 20:
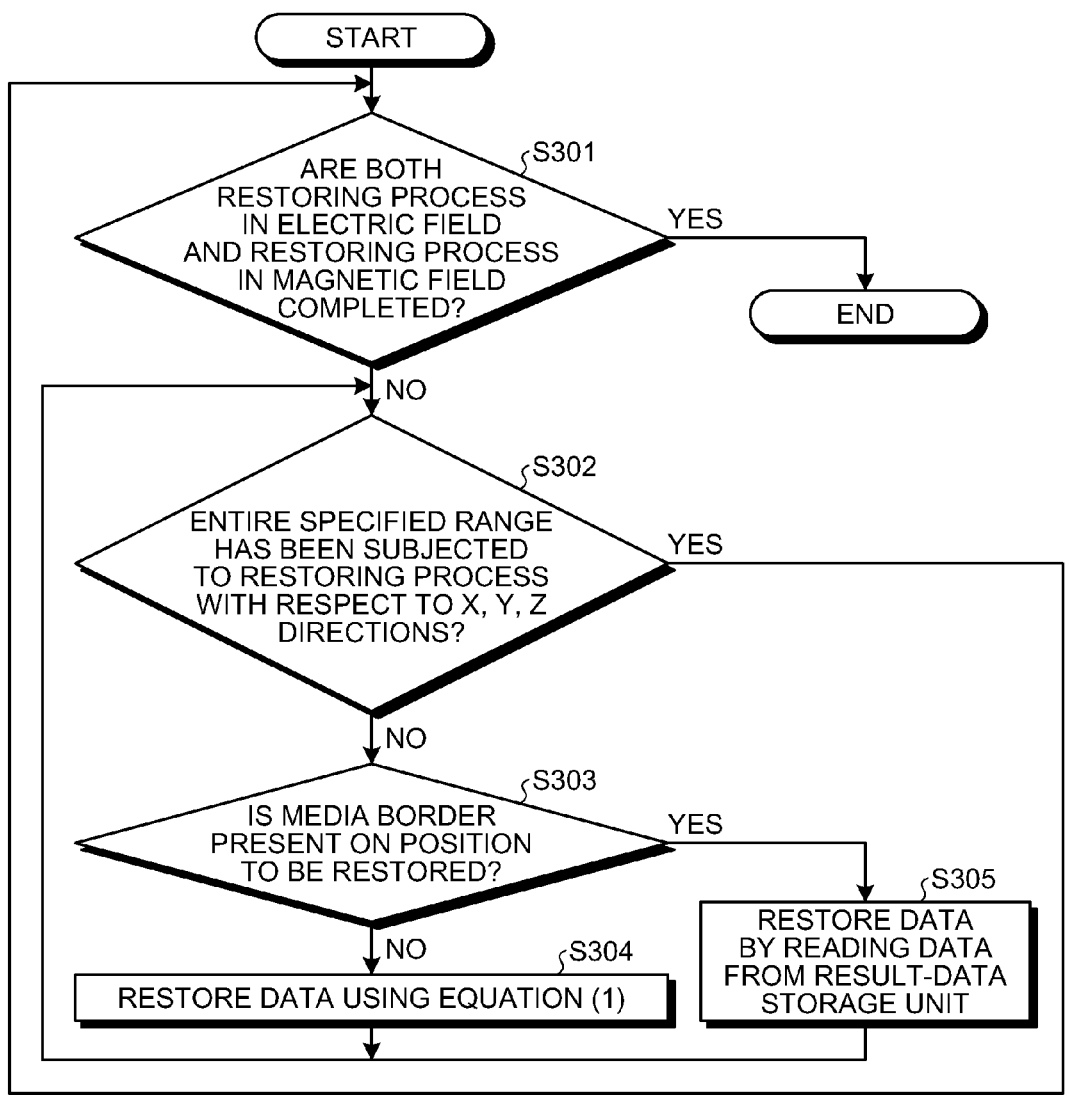
FIG. 20 is a flowchart of the data restoring process performed by the electromagnetic-wave analyzing apparatus according to the first embodiment.

The processing performed by the electromagnetic-wave analyzing apparatus 10 according to the first embodiment is described below with reference to FIGS. 18 to 20. FIG. 18 is a flowchart of the result-data storing process performed by the electromagnetic-wave analyzing apparatus according to the first embodiment. FIG. 19 is a flowchart of the skipping determination process performed by the electromagnetic-wave analyzing apparatus according to the first embodiment. FIG. 20 is a flowchart of the data restoring process performed by the electromagnetic-wave analyzing apparatus according to the first embodiment.

As illustrated in FIG. 18, upon receiving an instruction to start the calculation using the initial data for the electromagnetic-field analysis, the electromagnetic-wave analyzing apparatus 10 counts k, j, and i and serially determines whether k is larger than o, j is larger than n, and i is larger than m (Steps S101 to S103). In other words, the electromagnetic-wave analyzing apparatus 10 determines whether the range that is specified by the initial data with respect to the x axis, the y axis, and the z axis has been subjected to the calculation from end to end. When the later-described processes of Steps S104 to S109 are completed, the process control returns to Step S101, and k, j, and i are incremented. The result-data storing process repeats until the range has been subjected to the calculation from end to end with respect to the x axis, the y axis, and the z axis, i.e., it is determined that k is larger than o, j is larger than n, and is larger than m.

The electromagnetic-wave analyzing apparatus 10 calculates the electric field or the magnetic field (Step S104) and determines whether the calculated result data is on an edge (analysis border), which is unrestorable by linear interpolation (Step S105). If the result data is on the analysis border (Yes at Step S105), the electromagnetic-wave analyzing apparatus 10 stores the result data in the result-data storage unit 14c (Step S110).

If the result data is not on the analysis border (No at Step S105), the electromagnetic-wave analyzing apparatus 10 determines whether the result data is on a border between different materials, i.e., the media border (Step S106). More particularly, the electromagnetic-wave analyzing apparatus 10 reads the media data corresponding to the coordinates of the result data and the media data corresponding to the adjacent cell from the media-data storage unit 14a and determines whether the media number of the result data is different from the media number of the adjacent cell.

If the result data is on the media border (Yes at Step S106), the electromagnetic-wave analyzing apparatus 10 stores the result data in the result-data storage unit 14c (Step S110). If the result data is not on the media border (No at Step S106), the electromagnetic-wave analyzing apparatus 10 determines whether the result data is on a border on which a circuit element is arranged, i.e., the circuit-element border (Step S107). More particularly, the electromagnetic-wave analyzing apparatus 10 determines whether there is a circuit element corresponding to the coordinates of the result data by referring to the circuit-element-data storage unit 14b.

If the result data is on the circuit-element border (Yes at Step S107), the electromagnetic-wave analyzing apparatus 10 stores the result data in the result-data storage unit 14c (Step S110). If the result data is not on the circuit-element border (No at Step S107), the electromagnetic-wave analyzing apparatus 10 performs the skipping determination process (that is described in detail later with reference to FIG. 19) (Step S109).

If it is determined from a result of the skipping determination process that the result data is not to be skipped (No at Step S109), the electromagnetic-wave analyzing apparatus 10 stores the result data in the result-data storage unit 14c (Step S110). If the result data is to be skipped (Yes at Step S109), the process control returns to Step S101 without storing the result data by the electromagnetic-wave analyzing apparatus 10.

The skipping determination process is described with reference to FIG. 19. As illustrated in FIG. 19, the electromagnetic-wave analyzing apparatus 10 determines whether the data is to be skipped according to the skipping interval (Step S201). If the data is not to be skipped according to the skipping interval (No at Step S201), the electromagnetic-wave analyzing apparatus 10 determines whether the media border is present within the accuracy coefficient (Step S202).

If the media border is present within the accuracy coefficient (Yes at Step S202), the electromagnetic-wave analyzing apparatus 10 determines that the result data is not to be skipped (Step S203). If the data is to be skipped according to the skipping interval (Yes at Step S201), or the media border is not present within the accuracy coefficient (No at Step S202), the electromagnetic-wave analyzing apparatus 10 determines that the result data is to be skipped (Step S204).

The data restoring process is described with reference to FIG. 20. As illustrated in FIG. 20, upon receiving the instruction to start the restoring, the electromagnetic-wave analyzing apparatus 10 determines whether both the restoring process in the electric field and the restoring process in the magnetic field are completed (Step S301) and then determines whether the entire specified range has been subjected to the restoring process with respect to the x direction, the y direction, and the z direction (Step S302). In other words, the electromagnetic-wave analyzing apparatus 10 determines whether the specified range in both the electric field and the magnetic field has been subjected to the restoring process with respect to the x direction, the y direction, and the z direction. When the later-described processes of Steps S303 to S305 are completed, the process control returns to Step S301, and the subsequent processes are repeated.

The electromagnetic-wave analyzing apparatus 10 determines whether the media border is present on the position to be restored (Step S303). If the media border is not on the position to be restored (No at Step S303), the electromagnetic-wave analyzing apparatus 10 restores the result data using Equation (1) (Step S304).

If the media border is on a position to be restored (Yes at Step S303), the electromagnetic-wave analyzing apparatus 10 restores the result data by reading the result from the result-data storage unit 14c (Step S305). After that, the process control returns to Step S301, and the electromagnetic-wave analyzing apparatus 10 repeats the processes from Steps S301 to S305 until the entire specified range has been subjected to the restoring process with respect to the x direction, the y direction, and the z direction.

Effects of First Embodiment

As described above, the electromagnetic-wave analyzing apparatus 10 determines whether the result data that is calculated as a result of the analysis is restorable by linear interpolation. If the result data is unrestorable by linear interpolation, the electromagnetic-wave analyzing apparatus 10 stores the result data in the result-data storage unit 14c. After that, the electromagnetic-wave analyzing apparatus 10 reads the result data from the result-data storage unit 14c and restores the result data by linear interpolation using the result data that is acquired from the result-data storage unit 14c. With this configuration, the electromagnetic-wave analyzing apparatus 10 performs a highly accurate analysis process, storing therein a reduced amount of data by selecting only the result data extremely important for the restoring process.

The electromagnetic-wave analyzing apparatus 10 analyzes not the post-skipping data but the entire initial data and automatically selects data to be stored from among the analysis data that is obtained as a result of the analysis. With this configuration, the electromagnetic-wave analyzing apparatus 10 performs the highly accurate analysis process, storing therein a reduced amount of data.

Furthermore, the electromagnetic-wave analyzing apparatus 10 determines whether the data is restorable by linear interpolation. If the data is restorable by linear interpolation, the electromagnetic-wave analyzing apparatus 10 deletes the data. However, if the data is unrestorable by linear interpolation, the electromagnetic-wave analyzing apparatus 10 stores therein the data as data extremely important for the restoring process or as unrestorable data. With this configuration, the electromagnetic-wave analyzing apparatus 10 stores therein a reduced amount data by selecting only the result data extremely important for the restoring process.

In the first embodiment, the electromagnetic-wave analyzing apparatus 10 determines whether the result data is on a border between different materials, i.e., the media border. If the result data is on the media border, the electromagnetic-wave analyzing apparatus 10 stores the result data in the result-data storage unit 14c. Thus, the result data on the media border is stored in the result-data storage unit 14c as the result data extremely important for the restoring process and unrestorable by linear interpolation. With this configuration, the data is restored at a high accuracy.

Furthermore, in the first embodiment, the electromagnetic-wave analyzing apparatus 10 determines whether the result data is on the edge of the target range to be analyzed, i.e., on the analysis border. If the result data is on the analysis border, the electromagnetic-wave analyzing apparatus 10 stores the result data in the result-data storage unit 14c. Thus, the result data on the analysis border, which is unrestorable by linear interpolation because the data is arranged on the edge, is stored in the result-data storage unit 14c. With this configuration, the data is restored at a high accuracy.

Furthermore, in the first embodiment, the electromagnetic-wave analyzing apparatus 10 determines whether the result data is on a border on which a circuit element is arranged, i.e., on the circuit-element border. If the result data is on the circuit-element border, the electromagnetic-wave analyzing apparatus 10 stores the result data in the result-data storage unit 14c. Thus, the result data on the circuit-element border is stored in the result-data storage unit 14c as result data extremely important for the restoring process and unrestorable by linear interpolation. With this configuration, the data is restored at a high accuracy.

Furthermore, in the first embodiment, the electromagnetic-wave analyzing apparatus 10 receives the accuracy coefficient and determines whether the result data is within a range extending from the media border given by the received accuracy coefficient. If the result data is within the range, the electromagnetic-wave analyzing apparatus 10 stores the result data in the result-data storage unit 14c. As the accuracy coefficient increases, the restoring accuracy increases and the data compression ratio decreases. With this configuration, the user can adjust the balance between the restoring accuracy and the data compression ratio by adjusting the accuracy coefficient.

[b] Second Embodiment

The first embodiment of the present invention has been described above. However, the present invention can be implemented variously without being limited to the first embodiment. A second embodiment of the present invention is described below.

(1) Media Border

In the first embodiment, the electromagnetic-wave analyzing apparatus 10 stores therein all the result data on the media border. However, it is allowable to selectively store therein the result data on the media border. Suppose there is a case where various media are present in the range to be analyzed and the media borders are present extensively. In this case, if all the result data on the media border is stored, a decrease in the amount of data will be small. To reduce the amount of stored data, it is allowable to select a part of the result data on the media borders based on a predetermined condition (e.g., result data on a border between media that are different but having similar characteristics is not to be stored) and store only the selected result data.

Figure 21:
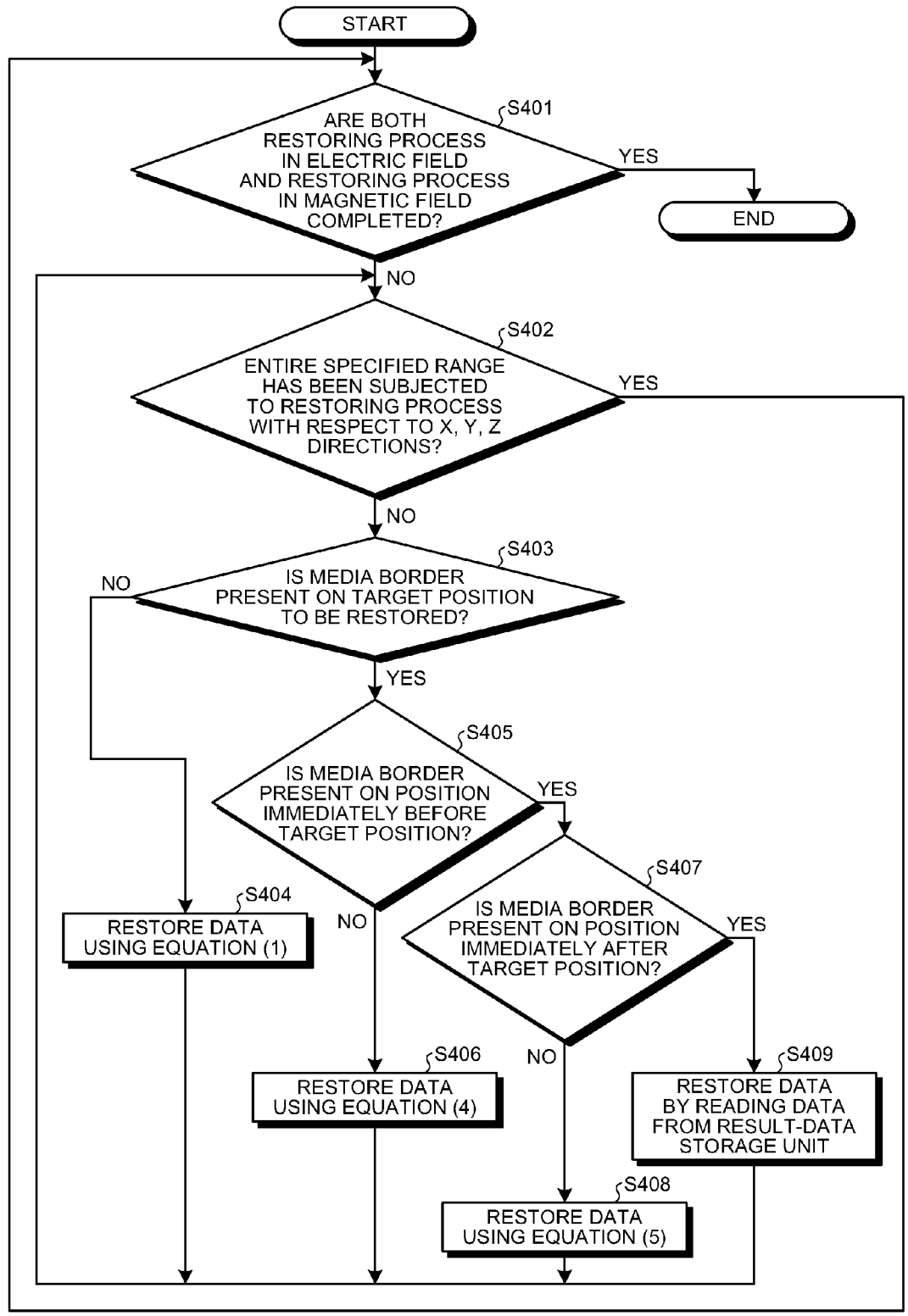
FIG. 21 is a flowchart of a data restoring process performed by an electromagnetic-wave analyzing apparatus according to a second embodiment of the present invention.

A restoring process in the above case where a part of the result data on the media border is unavailable is described with reference to FIGS. 21 to 23. As illustrated in FIG. 21, an electromagnetic-wave analyzing apparatus 20 according to the second embodiment determines whether a media border is present on the target position to be restored in the same manner as described with reference to FIG. 20 (Step S403). If a media border is present on the target position (Yes at Step S403), the electromagnetic-wave analyzing apparatus 20 determines whether a media border is present on a position immediately before the target position (Step S405).

Figure 22:
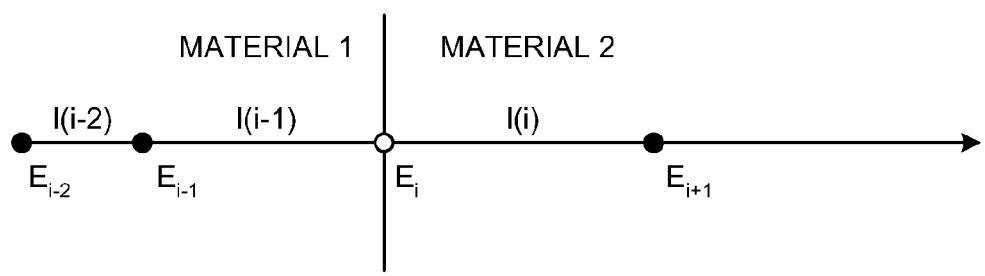
FIG. 22 and FIG. 23 are schematic diagrams of the data restoring process according to the second embodiment.
Figure 23:
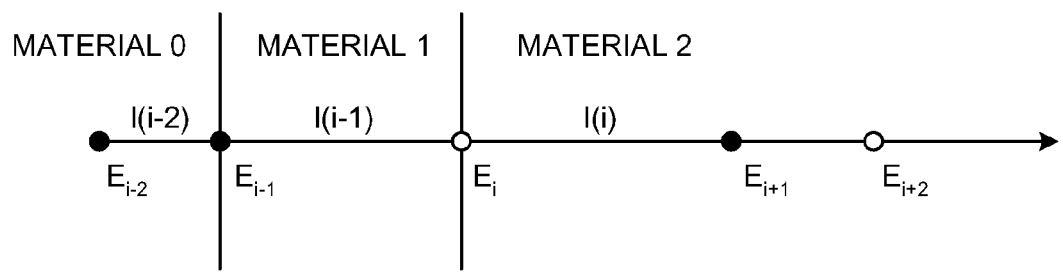

If a media border is not present on the position immediately before the target position (No at Step S405), the electromagnetic-wave analyzing apparatus 10 restores the result data using Equation (4) (Step S406), as in the example illustrated in FIG. 22. In the example illustrated in FIG. 22, a point $E_i$ is on the media border and points $E_{i-1}$ and $E_{i-2}$ are in the same medium.

$$E_i = E_{i-1} + \gamma(l(i-1)/l(i-2)) \cdot (E_{i+1} - E_{i-2}) \quad (4)$$

If a media border is present on the position immediately before the target position (Yes at Step S405), the electromagnetic-wave analyzing apparatus 20 determines whether a media border is present on a position immediately after the target position (Step S407). If a media border is not present on the position immediately after the target position (No at Step S407), as in the example illustrated in FIG. 23, the electromagnetic-wave analyzing apparatus 20 restores the result data using Equation (5). In the example illustrated in FIG. 23, the points $E_i$ and are on the media borders. After calculating a point $E_{i+2}$ using Equation (1), the point $E_i$ is calculated using the calculated point $E_{i+2}$ and Equation (5):

$$E_i = E_{i+1} + \gamma(l(i-1)/l(i+2)) \cdot (E_{i+2} - E_{i+1}) \quad (5)$$

If a media border is not present on the position immediately after the target position (Yes at Step S407), the electromagnetic-wave analyzing apparatus 20 restores the result data by reading the result data from the result-data storage unit 14c (Step S409).

In this manner, because it stores therein only a selected part of the result data on the media borders, even when various media are present in the range to be analyzed and the media borders are present extensively, an accurate restoring process is performed using a reduced amount of stored data.

(2) System Configuration and Others

The constituent elements of the device illustrated in the accompanying drawings are merely conceptual and need not be physically configured as illustrated. The constituent elements, as a whole or in part, can be separated or integrated either functionally or physically based on various types of loads or use conditions. For example, the electromagnetic-field calculating unit 13a and the result-data storing unit 13b can be formed as a unit. The process functions performed by the device are entirely or partially realized by the central processing unit (CPU) or computer programs that are analyzed and executed by the CPU, or realized as hardware by wired logic.

Of the processes described in the embodiments, all or part of the processes explained as being performed automatically can be performed manually. Similarly, all or part of the processes explained as being performed manually can be performed automatically by a known method. The processing procedures, the control procedures, specific names, various data, and information including parameters described in the embodiments or illustrated in the accompanying drawings can be changed as required unless otherwise specified.

(3) Computer Programs

Figure 24:
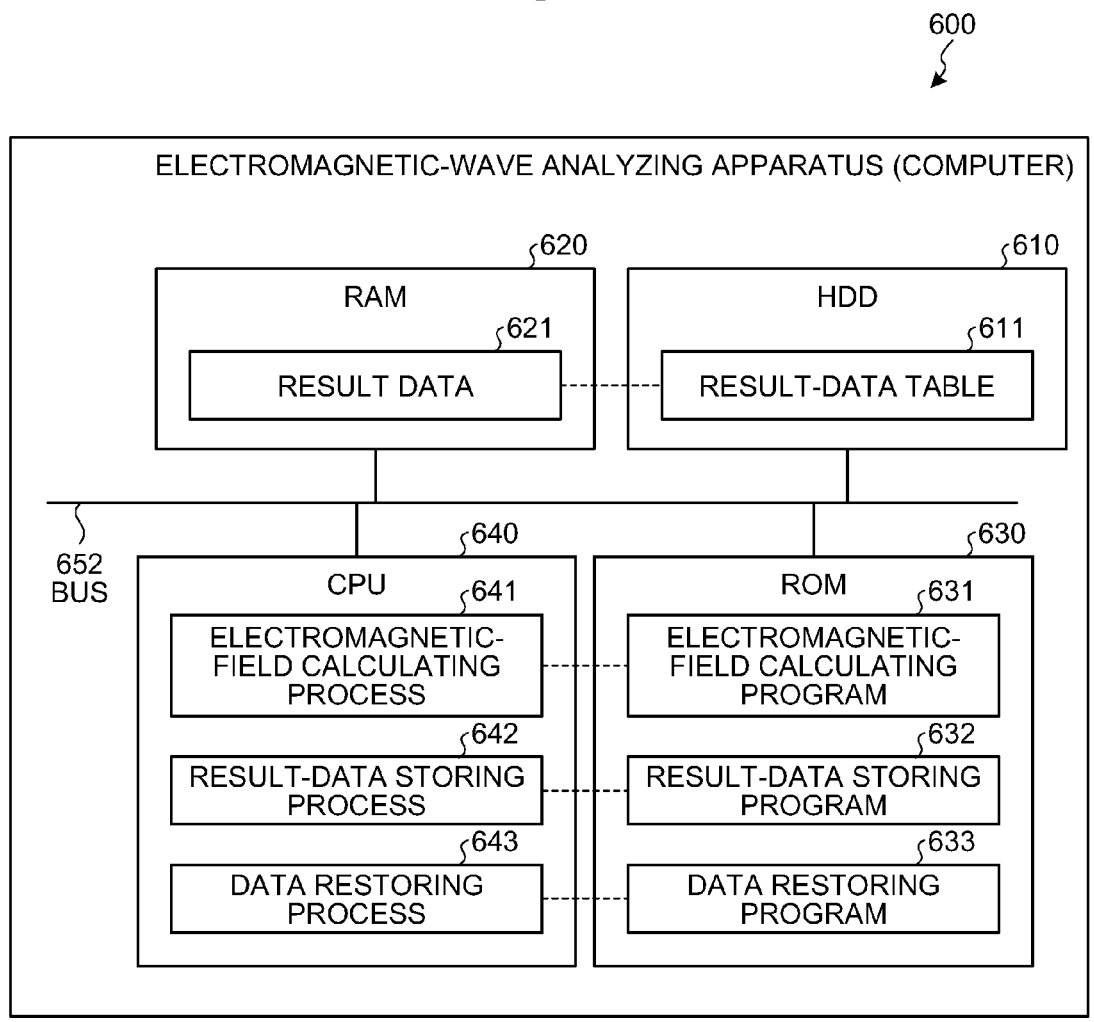
FIG. 24 is a block diagram of a computer that executes a result-data storing program.

An embodiment can be designed to perform the processes described in the embodiments by a computer executing predetermined computer programs. An example of a computer that executes the computer program to implement the same functions described in the embodiments is described with reference to FIG. 24. FIG. 24 is a block diagram of a computer 600 that executes a result-data storing program.

As illustrated in FIG. 24, the computer 600, which is the electromagnetic-wave analyzing apparatus, includes a hard disk drive (HDD) 610, a random access memory (RAM) 620, a read only memory (ROM) 630, and a CPU 640, which are all connected to each other via a bus 652.

The ROM 630 pre-stores therein, as illustrated in FIG. 24, an electromagnetic-field calculating program 631, a result-data storing program 632, and a data restoring program 633 as the result-data storing program that is used to implement the same functions described in the above embodiments. The computer programs 631 to 633 can be formed integrally or separately in the same manner as in the constituent elements of the electromagnetic-wave analyzing apparatus illustrated in FIG. 1.

The CPU 640 reads these computer programs 631 to 633 from the ROM 630 and executes the acquired computer programs 631 to 633, thereby implementing an electromagnetic-field calculating process 641, a result-data storing process 642, and a data restoring process 643. The electromagnetic-field calculating process 641, the result-data storing process 642, and the data restoring process 643 correspond to the electromagnetic-field calculating unit 13a, the result-data storing unit 13b, and the data restoring unit 13c illustrated in FIG. 1, respectively.

As illustrated in FIG. 24, the HDD 610 includes a result-data table 611. The result-data table 611 corresponds to the result-data storage unit 14c illustrated in FIG. 1. The CPU 640 stores data in the result-data table 611, reads result data 621 from the result-data table 611, stores the result data 621 in the RAM 620, and performs processes using the result data 621 that is stored in the RAM 620.

According to the embodiments of the invention, the following advantages are obtained. A highly precise analyzing process can be performed. While the amount of data is reduced, it is possible to properly store only calculation results that are highly necessary for a restoring process.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An analyzing apparatus comprising:
a storage unit; and
a processor coupled to the storage unit, wherein the processor executes a process comprising:
executing an electromagnetic field simulation;
determining whether result data that is calculated as a result of the electromagnetic field simulation is on one of following borders (a), (b) and (c):
(a) a media border that is a border between different materials;
(b) an analysis border that is an edge of a target range to be analyzed; and
(c) a circuit-element border that is a border on which a circuit element is arranged;
storing, in the storage unit, the result data determined to be on the one of the borders (a), (b) and (c);
reading the result data from the storage unit; and
performing linear interpolation using the result data read from the storage unit, thereby restoring the result data.

2. The analyzing apparatus according to claim 1,
wherein, the process further comprises receiving an accuracy coefficient for designating in which range from the media border the result data is stored;
the determining includes determining whether the result data is within a range designated by the accuracy coefficient, and
the storing includes storing, in the storage unit, the result data determined to be within the range.

3. A method of storing data comprising:
executing an electromagnetic field simulation;
determining, using a processor, whether result data that is calculated as a result of the electromagnetic field simulation is on one of following borders (a), (b) and (c):
(a) a media border that is a border between different materials;
(b) an analysis border that is an edge of a target range to be analyzed; and
(c) a circuit-element border that is a border on which a circuit element is arranged;
storing, in a storage unit, the result data determined to be on the one of the borders (a), (b) and (c);
reading the result data from the storage unit; and
performing, using the processor, linear interpolation using the result data read from the storage unit, thereby restoring the result data.

4. The method according to claim 3, further comprising:
receiving an accuracy coefficient for designating in which range from the media border the result data is stored; and
wherein the determining includes determining whether the result data is within a range designated by the accuracy coefficient and,
the storing includes storing, in the storage unit, the result data determined to be within the range.

5. A non-transitory computer-readable recording medium that stores therein a computer program that causes a processor to execute a process comprising:
executing an electromagnetic field simulation;
determining whether result data that is calculated as a result of the electromagnetic field simulation is on one of following borders (a), (b) and (c):
(a) a media border that is a border between different materials;
(b) an analysis border that is an edge of a target range to be analyzed; and
(c) a circuit-element border that is a border on which a circuit element is arranged;
storing, in a storage unit, the result data determined to be on the one of the borders (a), (b) and (c);
reading the result data from the storage unit; and
performing linear interpolation using the result data read from the storage unit, thereby restoring the result data.

6. The non-transitory medium according to claim 5, wherein the process further comprises receiving an accuracy coefficient for designating in which range from the media border the result data is stored,
the determining includes determining whether the result data is within a range designated by the accuracy coefficient, and
the storing includes storing, in the storage unit, the result data determined to be within the range.

* * * * *